United States Patent
Ido et al.

(10) Patent No.: US 9,922,849 B2
(45) Date of Patent: Mar. 20, 2018

(54) SUBSTRATE LIQUID PROCESSING APPARATUS HAVING NOZZLE WITH MULTIPLE FLOW PATHS AND SUBSTRATE LIQUID PROCESSING METHOD THEREOF

(71) Applicant: Tokyo Electron Limited, Tokyo (JP)

(72) Inventors: Yasuyuki Ido, Yamanashi (JP); Naoki Shindo, Yamanashi (JP); Takehiko Orii, Yamanashi (JP); Keisuke Egashira, Kumamoto (JP); Yosuke Hachiya, Kumamoto (JP); Kotaro Ooishi, Kumamoto (JP); Hisashi Kawano, Kumamoto (JP); Shinichiro Shimomura, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 211 days.

(21) Appl. No.: 14/689,129

(22) Filed: Apr. 17, 2015

(65) Prior Publication Data
US 2015/0318183 A1    Nov. 5, 2015

(30) Foreign Application Priority Data

Apr. 30, 2014  (JP) ................................. 2014-094152

(51) Int. Cl.
*H01L 21/67* (2006.01)
*H01L 21/31* (2006.01)
(Continued)

(52) U.S. Cl.
CPC ...... *H01L 21/67051* (2013.01); *H01L 21/306* (2013.01); *H01L 21/31* (2013.01);
(Continued)

(58) Field of Classification Search
None
See application file for complete search history.

(56) References Cited

U.S. PATENT DOCUMENTS

| 6,878,401 | B2 | 4/2005 | Nishijima et al. |
| 7,357,842 | B2 * | 4/2008 | Ishikawa ................ G03B 27/32 |
| | | | 118/50 |

(Continued)

FOREIGN PATENT DOCUMENTS

| JP | 2003-178965 A | 6/2003 |
| JP | 2012-222329 A | 11/2012 |

*Primary Examiner* — Karl Kurple
(74) *Attorney, Agent, or Firm* — Abelman, Frayne & Schwab

(57) ABSTRACT

Disclosed is a substrate liquid processing apparatus. The substrate liquid processing apparatus includes a processing unit, a nozzle, a silylation liquid supply mechanism, and a blocking fluid supply mechanism. The processing unit performs a water repellency imparting processing on a substrate by supplying a silylation liquid to the substrate. The nozzle includes an ejection port configured to supply the silylation liquid to the substrate positioned in the processing unit, and a silylation liquid flow path in which the silylation liquid flows toward the ejection port. The silylation liquid supply mechanism supplies the silylation liquid to the silylation liquid flow path in the nozzle through a silylation liquid supply line. The blocking fluid supply mechanism supplies a blocking fluid that blocks the silylation liquid within the silylation liquid flow path in the nozzle from an atmosphere outside the ejection port.

14 Claims, 7 Drawing Sheets

(51) Int. Cl.
  *H01L 21/306* (2006.01)
  *B05B 12/14* (2006.01)
  *B05C 11/115* (2006.01)
(52) U.S. Cl.
  CPC .... *H01L 21/6715* (2013.01); *H01L 21/67017* (2013.01); *B05B 12/14* (2013.01); *B05C 11/115* (2013.01)

(56) References Cited

U.S. PATENT DOCUMENTS

| | | | |
|---|---|---|---|
| 7,640,885 B2 | 1/2010 | Nakashima et al. | |
| 8,940,365 B2* | 1/2015 | Miyata | H01L 21/6715 118/320 |
| 2006/0121741 A1* | 6/2006 | Park | H01L 21/6715 438/758 |
| 2008/0087217 A1* | 4/2008 | Yudasaka | H01L 21/6715 118/313 |
| 2008/0139002 A1* | 6/2008 | Kato | H01L 21/6708 438/782 |
| 2009/0183676 A1* | 7/2009 | Fujii | H01L 21/6715 118/663 |
| 2010/0051059 A1* | 3/2010 | Kometani | B08B 9/00 134/21 |
| 2011/0143545 A1* | 6/2011 | Okuchi | H01L 21/02057 438/706 |
| 2012/0045581 A1* | 2/2012 | Kimura | H01L 21/02057 427/248.1 |
| 2012/0187083 A1* | 7/2012 | Hashizume | H01L 21/67063 216/37 |
| 2012/0322273 A1* | 12/2012 | Oori | H01L 21/02282 438/765 |
| 2013/0025537 A1* | 1/2013 | Sasahara | H01L 22/12 118/697 |
| 2013/0052828 A1* | 2/2013 | Hashizume | H01L 21/0206 438/694 |
| 2015/0325458 A1* | 11/2015 | Printz | H01L 21/67028 134/30 |

* cited by examiner

SUBSTRATE LIQUID PROCESSING APPARATUS HAVING NOZZLE WITH MULTIPLE FLOW PATHS AND SUBSTRATE LIQUID PROCESSING METHOD THEREOF

CROSS-REFERENCE TO RELATED APPLICATIONS

This application is based on and claims priority from Japanese Patent Application No. 2014-094152, filed on Apr. 30, 2014, with the Japan Patent Office, the disclosures of which are incorporated herein in their entireties by reference.

TECHNICAL FIELD

The present disclosure relates to a substrate liquid processing apparatus which is provided with a nozzle for supplying silylation liquid to impart water repellency on a surface of a substrate such as, for example, a semiconductor wafer.

BACKGROUND

In manufacturing a semiconductor device, various liquid processings such as, for example, a wet etching and a chemical cleaning, are performed on a substrate such as, for example, a semiconductor wafer. In the liquid processing, for example, a chemical liquid process for supplying a chemical liquid to a substrate, and a rinse process for supplying a rinse liquid to the substrate and a drying process for drying the substrate are sequentially performed. When a pattern, especially a pattern having a high aspect ratio is formed on a surface of the substrate, a water-repellent process for supplying a water-repellent liquid, for example, a silylation liquid, to the substrate to impart water repellency on the surface of the substrate is performed before a drying process so that the collapse of the pattern may not occur during the drying process. Since a contact angle of the rinse liquid is increased by the water-repellent process, the collapse of the pattern, which is caused by the surface tension of the rinse liquid, is suppressed. See, for example, Japanese Patent Laid-Open Publication No. 2012-222329.

The silylation liquid easily hydrolyzed with water in the atmospheric air to be degraded. Therefore, when the ejection of silylation liquid is stopped for a long time after a predetermined amount of silylation liquid is ejected from a nozzle toward a substrate, the silylation liquid staying in the vicinity of an ejection port of the nozzle is degraded by the hydrolysis. In order to remove the degraded silylation liquid from the inner portion of the nozzle, a predetermined amount of silylation liquid is ejected from the nozzle (a dummy dispensation is performed) so to be discarded before the silylation liquid is supplied to the next substrate. Since the price of the silylation liquid is very high, it is desirable that the waste amount thereof should be reduced as much as possible.

SUMMARY

According to an exemplary embodiment of the present disclosure, there is provided a substrate liquid processing apparatus including: a processing unit configured to perform a water repellency imparting processing on a substrate by supplying a silylation liquid to the substrate; a nozzle including therein an ejection port configured to supply the silylation liquid to the substrate positioned in the processing unit, and a silylation liquid flow path in which the silylation liquid flows toward the ejection port; a silylation liquid supply mechanism configured to supply the silylation liquid to the silylation liquid flow path in the nozzle through a silylation liquid supply line; and a blocking fluid supply mechanism configured to supply a blocking fluid that blocks the silylation liquid within the silylation liquid flow path in the nozzle from an atmosphere outside the ejection port.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
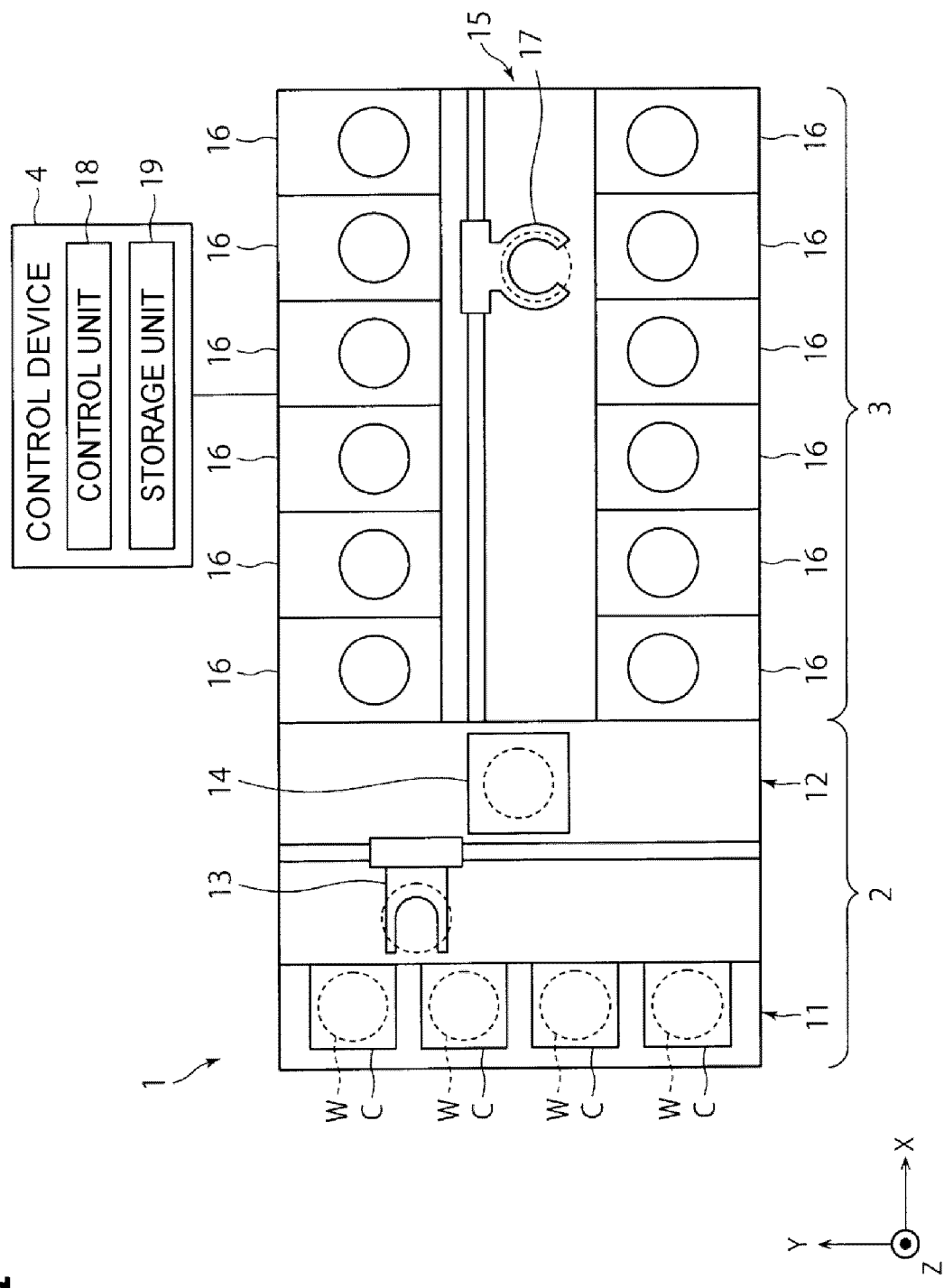
FIG. 1 is a schematic plan view illustrating an overall configuration of a substrate processing system.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

An object of the present disclosure is to provide a technique which is capable of reducing the waste amount of high cost silylation liquid.

According to an exemplary embodiment of the present disclosure, there is provided a substrate liquid processing apparatus including: a processing unit configured to perform a water repellency imparting processing on a substrate by supplying a silylation liquid to the substrate; a nozzle including therein an ejection port configured to supply the silylation liquid to the substrate positioned in the processing unit, and a silylation liquid flow path in which the silylation liquid flows toward the ejection port; a silylation liquid supply mechanism configured to supply the silylation liquid to the silylation liquid flow path in the nozzle through a silylation liquid supply line; and a blocking fluid supply mechanism configured to supply a blocking fluid that blocks the silylation liquid within the silylation liquid flow path in the nozzle from an atmosphere outside the ejection port.

In the substrate liquid processing apparatus, the nozzle includes a blocking fluid flow path connected to the silylation liquid flow path at an upstream side of the ejection port, and the blocking fluid flow path is connected to the blocking fluid supply mechanism through a blocking fluid supply line.

In the substrate liquid processing apparatus, the blocking fluid is a liquid, and the blocking fluid supply mechanism includes an opening/closing valve on the blocking fluid supply line. The blocking fluid supply mechanism is configured to open the opening/closing valve for a predetermined length of time and close the opening/closing valve after the blocking fluid is supplied to the silylation liquid flow path so that the silylation liquid flow path from a position, where the blocking fluid flow path is connected, to the ejection port is filled with the blocking fluid.

In the substrate liquid processing apparatus, the blocking fluid is an organic solvent.

In the substrate liquid processing apparatus, the silylation liquid is a water-repellent agent diluted by a thinner, and the blocking fluid is the thinner.

In the substrate liquid processing apparatus, the blocking fluid is compatible with the silylation liquid, and is also compatible with a pure water.

In the substrate liquid processing apparatus, the blocking fluid is a gas, and the blocking fluid supply mechanism includes an opening/closing valve interposed in the blocking fluid supply line. The blocking fluid supply is configured to continuously supply the gas to the blocking fluid flow path in a state where the opening/closing valve is opened so that the blocking fluid flow path and the silylation liquid flow path from a position, in which the blocking fluid flow path is connected, to the ejection port are filled with the blocking fluid.

In the substrate liquid processing apparatus, the blocking fluid is a liquid, the blocking fluid supply mechanism includes a liquid storage unit configured to store the blocking fluid, and a drain line is connected to the silylation liquid supply line through a drain line opening/closing valve. When the drain line opening/closing valve is opened in a state where the ejection port of the nozzle is immersed in the blocking fluid stored in the liquid storage unit, the blocking fluid is sucked into the nozzle while discharging the silylation liquid in the silylation liquid supply line from the drain line, and when drain line opening/closing valve is closed, the ejection port is blocked from an atmosphere outside the ejection port by the blocking fluid.

According to another exemplary embodiment of the present disclosure, there is provided a substrate liquid processing method using the substrate liquid processing apparatus described above. The substrate liquid processing method includes: performing a water repellency imparting processing on the substrate water repellent by supplying the silylation liquid to the substrate from the ejection port of the nozzle; stopping the supply of the silylation liquid from the nozzle; and supplying the blocking fluid to the silylation liquid flow path to block the silylation liquid within the silylation liquid flow path from an atmosphere outside the ejection port by the blocking fluid.

In the substrate liquid processing method, the nozzle includes the nozzle includes a blocking fluid flow path connected to the silylation liquid flow path at a connection position set at an upstream side of the ejection port, and the blocking fluid is supplied to the silylation liquid flow path in the nozzle from the blocking fluid flow path. The silylation liquid within the silylation liquid flow path at a downstream side of the connection position is purged by the blocking fluid and the silylation liquid within the silylation liquid flow path at the upstream side of the connection position is blocked from the atmosphere outside the ejection port by the blocking fluid.

In the substrate liquid processing method, the blocking fluid is a liquid, and flowing of the blocking fluid is stopped after the silylation liquid is purged by the blocking fluid so that the blocking fluid flow path and the silylation path from the connection position to the ejection port are filled with the blocking fluid.

In the substrate liquid processing method, the blocking fluid is an organic solvent.

In the substrate liquid processing method, silylation liquid is a water-repellent agent diluted by a thinner, and the blocking fluid is the thinner.

In the substrate liquid processing method, the blocking fluid is compatible with the silylation liquid, and is also compatible with pure water.

In the substrate liquid processing method, the blocking fluid is a gas, and the blocking fluid flow path and the silylation path from the connection position to the ejection port are filled with the blocking fluid by continuously supplying the blocking fluid to the blocking fluid flow path even after the silylation liquid is purged by the blocking fluid.

According to the present disclosure, it is possible to suppress or delay the degradation of a silylation liquid which is caused by hydrolysis of the silylation liquid remaining in the vicinity of the ejection port of a nozzle, thereby reducing the number of times of dummy dispensation. As a result, the waste amount of an expensive silylation liquid can be reduced.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a conveyance section 12. In the carrier placing section 11, a plurality of carriers C is placed to accommodate a plurality of wafers W horizontally.

The conveyance section 12 is provided adjacent to the carrier placing section 11, and provided with a substrate conveyance device 13 and a delivery unit 14. The substrate conveyance device 13 is provided with a wafer holding mechanism configured to hold the wafer W. Further, the substrate conveyance device 13 is movable horizontally and vertically and pivotable around a vertical axis, and conveys the wafers W between the carriers C and the delivery unit 14 by using the wafer holding mechanism.

The processing station 3 is provided adjacent to the conveyance section 12. The processing station 3 is provided with a conveyance section 15 and a plurality of processing units 16. The plurality of processing units 16 is arranged at both sides of the conveyance section 15.

The conveyance section 15 is provided with a substrate conveyance device 17 therein. The substrate conveyance device 17 is provided with a wafer holding mechanism configured to hold the wafer W. Further, the substrate conveyance device 17 is movable horizontally and vertically and pivotable around a vertical axis. The substrate conveyance device 17 conveys the wafers W between the delivery unit 14 and the processing units 16 by using the wafer holding mechanism.

The processing units 16 perform a predetermined substrate processing on the wafers W conveyed by the substrate conveyance device 17.

Further, the liquid processing system 1 is provided with a control device 4. The control device 4 is, for example, a computer, and includes a control unit 18 and a storage unit 19. The storage unit 19 stores a program that controls various processings performed in the liquid processing system 1. The control unit 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate conveyance device 13 of the carry-in/out station 2 first takes out a wafer W from a carrier C placed in the carrier placing section 11, and then places the taken wafer W on the conveyance unit 14. The wafer W placed on the conveyance unit 14 is taken out from the conveyance unit 14 by the substrate conveyance device 17 of the processing station 3 and carried into a processing unit 16.

The wafer W carried into the processing unit 16 is processed by the processing unit 16, and then, carried out from the processing unit 16 and placed on the delivery unit 14 by the substrate conveyance device 17. After the processing of placing the wafer W on the delivery unit 14, the wafer W returns to the carrier C of the carrier placing section 11 by the substrate conveyance device 13.

Figure 2:
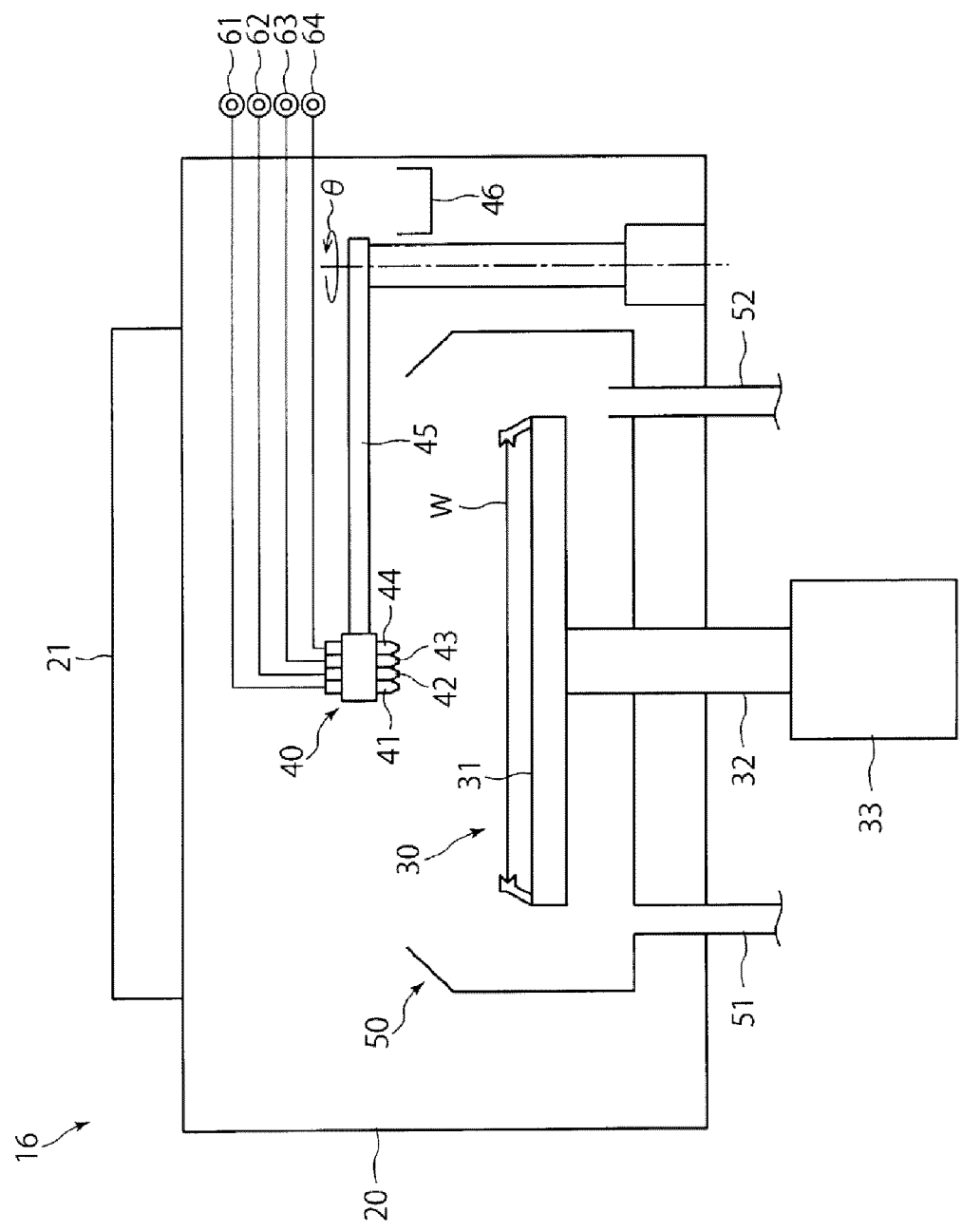
FIG. 2 is a schematic vertical cross-sectional view illustrating a processing unit.

Next, a schematic configuration of the processing unit 16 will be described with reference to FIG. 2. FIG. 2 is a view schematically illustrating the processing unit 16.

As illustrated in FIG. 2, the processing unit 16 includes a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds a wafer W horizontally. The support unit 32 is a vertically extending member, and has a base end portion rotatably supported by the driving unit 33 and a tip end portion supporting the holding unit 31 horizontally. The driving unit 33 rotates the support unit 32 around the vertical axis. When the substrate holding mechanism 30 rotates the support unit 32 using the driving unit 33, the holding unit 31 supported by the support unit 32 is rotated, and hence, the wafer W held in the holding unit 31 is rotated.

The processing fluid supply unit 40 supplies a processing fluid onto the wafer W.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside.

The processing fluid supply unit 40 includes a chemical liquid nozzle 41 configured to supply a chemical liquid to the wafer W, a rinse liquid nozzle 42 configured to supply a rinse liquid such as, for example, deionized water (DIW), to the wafer W, a silylation liquid nozzle 43 configured to supply silylation liquid to the wafer W, and a solvent nozzle 44 configured to supply an organic solvent for replacement which is compatible with both the rinse liquid and silylation liquid, for example, isopropyl alcohol (IPA), to the wafer W.

The chemical liquid nozzle 41, the rinse liquid nozzle 42, the silylation liquid nozzle 43, and the solvent nozzle 44 are attached one common arm 45. The arm 45 is rotatable around a vertical axis (rotation of the θ direction), and is able to move the nozzles 41 to 44 between a processing position which is positioned immediately above the center of the wafer W held by the substrate holding mechanism 30 and a retreat position where is the substrate holding mechanism retreats from a position above the wafer W.

Immediately below the chemical liquid nozzle 41, the rinse liquid nozzle 42, the silylation liquid nozzle 43 and the solvent nozzle 44 which are positioned at the retreat position, a liquid receiver 46 is provided to receive the liquid ejected from the nozzles 42 to 43. Further, when the nozzles 41 to 44 are positioned at the retreat position, the arm 45 is positioned outside the recovery cup 50 and the longitudinal direction thereof directed in the substantially vertical direction with respect to the sheet of FIG. 2. The liquid receiver 46 leads to a waste liquid system which is provided in a semiconductor device manufacturing factory.

The chemical liquid nozzle 41 is supplied with a chemical liquid from a chemical liquid supply mechanism 61. The rinse liquid nozzle 42 is supplied with a rinse liquid from a rinse liquid supply mechanism 62. The silylation liquid nozzle 43 is supplied with a silylation liquid from the silylation liquid supply mechanism 63. The solvent nozzle 44 is supplied with an organic solvent for replacement from the solvent supply mechanism 64. Each of the various liquid supply mechanisms 61 to 64 described above is constituted with, for example, an opening/closing valve and a mass flow controller which are interposed in a pipeline connected to a supply source of a corresponding liquid. The supply sources of the chemical liquid, the silylation liquid, and the organic solvent for replacement are, for examples, tanks for storing the liquids, and the supply source of the rinse liquid is a pure water supply source which is provided in a semiconductor device manufacturing factory.

The chemical liquid refers to an optional liquid for use in substrate processing, and may be, for example, an acid liquid, an alkaline liquid, or an organic liquid. Specifically, SC-1 liquid, SC-2 liquid, dilute hydrofluoric acid (DHF), buffered hydrofluoric acid, ozone water, and a photoresist developer may be exemplified, but the chemical liquid is not limited thereto.

As the silylation liquid, a water-repellent agent for imparting water repellency on the surface of the wafer W may be used after it is diluted by a thinner (diluent). As the water-repellent agent, for example, trimethylsilyldimethylamine (TMSDMA), dimethylsilyldimethylamine (DMSDMA), trimethylsilyldiethylamine (TMSDEA), hexamethyldisilazane (HMDS), or 1,1,3,3-tetramethyldisiloxane (TMDS) may be used. As the thinner, for example, an ether-based solvent or a ketone-based organic solvent may be used, for example. Specifically, propylene glycol monomethyl ether acetate (PGMEA), cyclohexanone or hydrofluoroether (HFF) may be used as the thinner, for example.

Hereinafter, descriptions will be made assuming that TMSDMA diluted using PGMEA is used as the silylation liquid, and IPA is used as the organic solvent for replacement.

First Exemplary Embodiment of Silylation Liquid Nozzle

Figure 3:
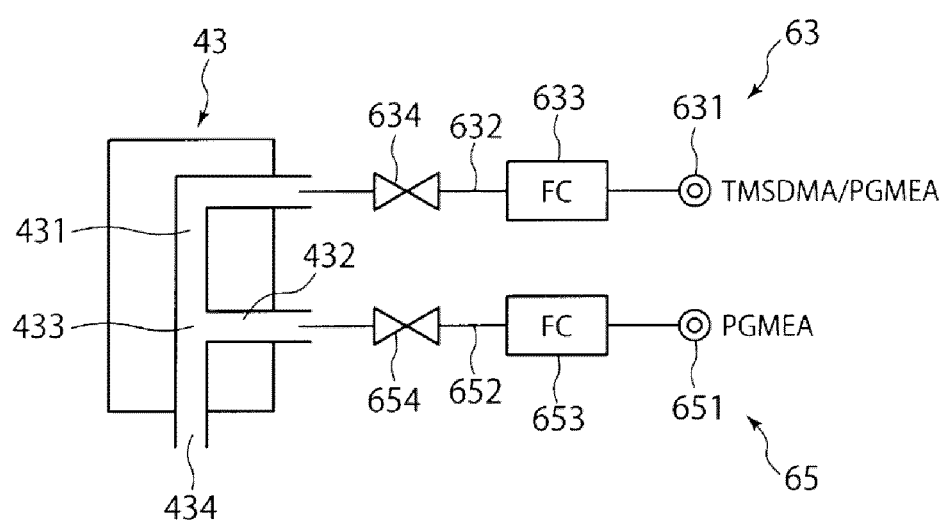
FIG. 3 is a schematic view illustrating a silylation liquid nozzle and a fluid supply mechanism accompanying with the silylation liquid nozzle.

Next, a configuration of the silylation liquid nozzle 43 will be described with reference to FIG. 3.

The silylation liquid nozzle 43 includes a silylation liquid flow path 431 and a blocking fluid flow path 432 which joins the silylation liquid flow path 431 at a junction 433.

The silylation liquid flow path 431 is supplied with a silylation liquid from the silylation liquid supply mechanism 63. The silylation liquid supply mechanism 63 includes a silylation liquid supply source 631 constituted by, for example, a tank for storing the silylation liquid, a silylation liquid supply line 632 connected to the silylation liquid supply source 631, a flow rate control mechanism (FC) 633, and an opening/closing valve 634, in which the flow rate control mechanism (FC) 633 and the opening/closing valve 634 are interposed in the silylation liquid supply line 632.

The blocking fluid flow path 432 is supplied with a blocking fluid from a blocking fluid supply mechanism 65. The blocking fluid supply mechanism 65 includes a blocking fluid supply source 651 including, for example, a tank for storing the blocking fluid (here PGMEA (a thinner (diluent) of silylation liquid), a blocking fluid supply line 652 connected to the blocking fluid supply source 651, a flow rate control mechanism (FC) 653, and an opening/closing valve 654, in which the flow rate control mechanism (FC) 653 and the opening/closing valve 654 are interposed in the blocking fluid supply line 652.

The flow rate controller 633 may include, for example, a flowmeter, a positive pressure valve, and a needle valve (not illustrated) which are sequentially interposed in the silylation liquid supply line 632 from the upstream side thereof. The flow rate controller 653 and the flow rate controller of each of the supply mechanisms 61, 62 and 64 may also be constituted to have the same as the flow rate controller 633.

Next, an operating method of the processing unit 16 will be described.

The substrate conveyance device 17 carries a wafer W into the processing unit 16 and the wafer W is held on the holding unit 31 of the substrate holding mechanism 30.

[Chemical Liquid Processing Process]

The substrate holding mechanism 30 rotates the hold wafer W at a predetermined speed. The arm 45 pivots to position the chemical liquid nozzle 41 at a processing position. A chemical liquid, for example, DHF, is ejected from the chemical liquid nozzle 41 for a predetermined time, and a predetermined chemical liquid processing is performed on the wafer W.

[First Rinse Process]

After the chemical liquid processing process is terminated (the ejection of the chemical liquid is stopped), DIW serving as a rinse liquid is ejected from the rinse liquid nozzle 42 for a predetermined time while continuously rotating the wafer W. Thus, the chemical liquid and a reaction product on the wafer W are washed away by the DIW.

[First Solvent Replacement Process]

After the first rinse process is terminated (the ejection of the rinse liquid is stopped), IPA serving as an organic solvent for replacement is ejected from the solvent nozzle 44 which is positioned at the processing position for a predetermined time while continuously rotating the wafer W. Accordingly, the DIW on the wafer W is replaced with the IPA.

[Silylation Process]

After the first solvent replacement process is terminated (the ejection of the IPA is stopped), the liquid obtained by diluting TMSDMA by PGMEA, which serves as the silylation liquid for replacement, is ejected from silylation liquid nozzle 43 positioned at the processing position for a predetermined time while continuously rotating the wafer W. Thus, the IPA on the wafer W is replaced with the silylation liquid, and the surface of the wafer W is made to be water-repellent by the silylation liquid.

[Second Solvent Replacement Process]

After the silylation process is terminated (the ejection of the silylation liquid is stopped), IPA serving as the organic solvent for replacement is ejected from the solvent nozzle 44 which is positioned at the processing position for a predetermined time while continuously rotating the wafer W. Accordingly, the silylation liquid on the wafer W is replaced with the IPA.

[Second Rinse Process]

After the second solvent replacement process is terminated (the ejection of the IPA is stopped), DIW serving as the rinse liquid is ejected from the rinse liquid nozzle 42 positioned at the processing position for a predetermined time while continuously rotating the wafer W. Accordingly, the IPA on the wafer W is replaced with the DIW and the residue of the reaction product which is generated during the silylation process is washed away by the DIW. Further, the second rinse process may be omitted.

[Drying Process]

After the second rinse process is terminated (the ejection of the DIW is stopped), the arm is pivoted to return to the retreat position and the wafer W is continuously rotated. Thus, the DIW on the wafer W is scattered, shaken off, and dried out by a centrifugal force. Since the surface of the wafer W is made to be water-repellent, the patterns formed on the wafer W are prevented from being collapsed by the surface tension of the DIW when the DIW existing between the patterns comes out of the patterns. Therefore, a series of processings on the wafer W are terminated, and the processed wafer W is carried out from the processing unit 16 by the substrate conveyance device 17.

Figure 4A:
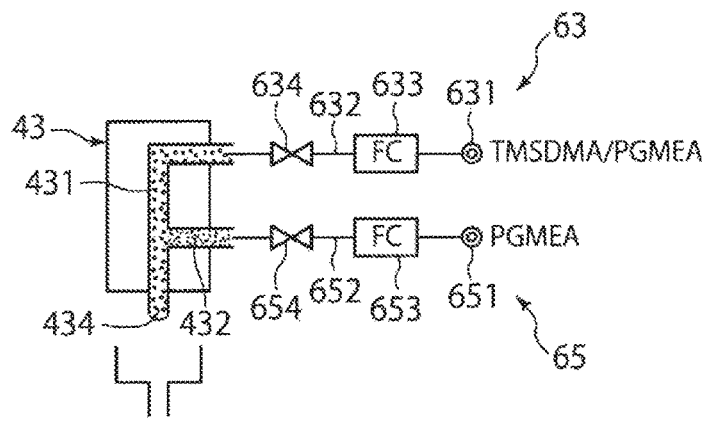
FIGS. 4A to 4D are views for describing an action of a silylation liquid nozzle according to a first exemplary embodiment.

FIG. 4A illustrates the state of the silylation liquid nozzle 43 returned to the retreat position after the above series of processings are terminated. At this time, both the opening/closing valve 634 of the silylation liquid supply line 632 and the opening/closing valve 654 of the blocking fluid supply line 652 are closed. In FIG. 4A, the entire silylation liquid flow path 431 is filled with silylation liquid (TMSDMA/PGMEA) (illustrated with large and coarse dots in FIGS. 4A to 7B). The liquid surface of the silylation liquid exposed to the atmospheric air (clean air within the chamber 20), which is the atmosphere outside of the nozzle, exists in the ejection port 434 which is the lower end (terminal end) of the silylation liquid flow path 431. When the silylation liquid is left in this state, the hydrolysis reaction occurs between the silylation liquid and water included in the atmospheric air, thereby degrading the silylation liquid. When the silylation liquid is left in the state for a longer time, a solid material is generated. The solid material may cause of generation of particles.

Figure 4B:
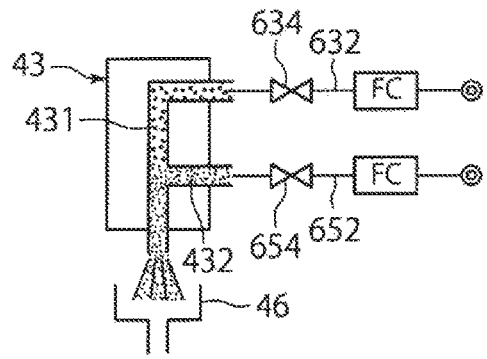

In the present exemplary embodiment, after the silylation liquid nozzle 43 is returned to the retreat position, preferably, immediately after the silylation liquid nozzle 43 is returned to the retreat position, PGMEA (illustrated with small and fine dots in FIGS. 4A to 7B) serving as the blocking fluid is ejected from the silylation liquid nozzle 43 by opening the opening/closing valve 654 of the blocking fluid supply line 652 as illustrated in FIG. 4B. Thus, the silylation liquid (TMSDMA/PGMEA) staying in the vicinity of the ejection port 434 of the silylation liquid flow path 431 is pushed out (purged) by the blocking fluid (PGMEA). Further, the silylation liquid and blocking fluid ejected from the silylation liquid nozzle 43 are received by the liquid receiver 46 for dummy dispensation, and then discarded to a plant waste liquid system which is an organic system.

Figure 4C:
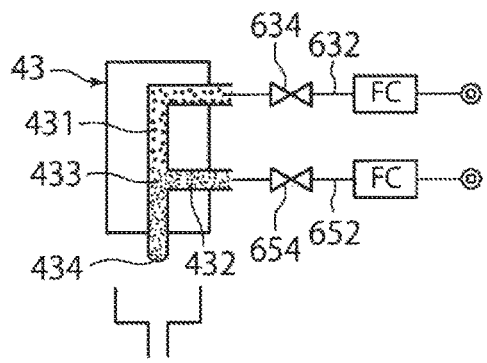

Thereafter, when the opening/closing valve 654 of the blocking fluid supply line 652 is closed, the state illustrated in FIG. 4C is obtained. That is, the area from the ejection port 434 to the vicinity of a junction 433 within the silylation liquid flow path 431 is filled with the PGMEA serving as the blocking fluid, and the silylation liquid exists only at the side upstream of the junction 433. That is, the contact between the silylation liquid and the atmospheric air which is the atmosphere outside the silylation liquid nozzle 43 is blocked by the PGMEA serving as the blocking fluid. Thus, it is possible to prevent the hydrolysis of the silylation liquid.

Figure 4D:
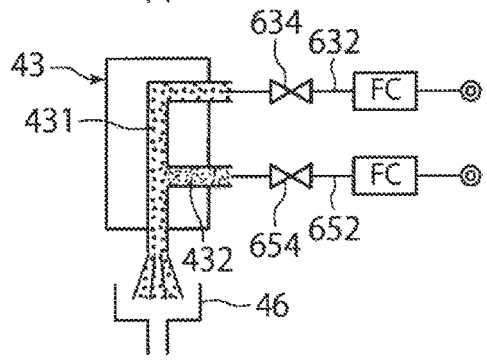

Next, when the silylation liquid is supplied to the wafer W from the silylation liquid nozzle 43, the silylation liquid is ejected from the silylation liquid nozzle 43 by opening the opening/closing valve 634 of the silylation liquid supply line 632 in a state in which the silylation liquid nozzle 43 is positioned at the retreat position. Therefore, as illustrated in FIG. 4D, the blocking fluid (PGMEA) staying in the vicinity of the ejection port 434 of the silylation liquid flow path 431 is pushed out by the silylation liquid (TMSDMA/PGMEA). Thereafter, when the opening/closing valve 634 of the silylation liquid supply line 632 is closed, the state illustrated in FIG. 4A is obtained, and thus, the silylation liquid is ready to be ejected from the silylation liquid nozzle 43 toward the wafer W. Further, the silylation liquid may be directly ejected toward the wafer W in the state illustrated in FIG. 4C, omitting the process illustrated in FIG. 4D.

The sequence illustrated in FIGS. 4A to 4D are especially useful in a case where a relatively long time interval exists as a gap until a processing on the next wafer is performed after a series of processings on any one wafer W are terminated. In the conventional technique (the blocking fluid supply line 652 does not exist), when a silylation liquid is not ejected from the silylation liquid nozzle 43 for a long time period, the silylation liquid, which stayed in the vicinity of the ejection port 434 of the silylation liquid nozzle 43 and has been hydrolyzed, should be regularly discarded by the dummy dispensation. Whereas, in the exemplary embodiment described above, the sequence is terminated only by discarding the blocking fluid (PGMEA). The silylation liquid, especially the water-repellent agent component (TMSDMA), is very expensive. Thus, according to the exemplary embodiment described above, the cost may be reduced by the cost of the discarded chemical liquid.

The exemplary embodiment described above uses PGMEA which is a component of the silylation liquid as the blocking fluid. Thus, there is no risk of occurrence of a reaction in which a material to a processing of a wafer W is generated between the water-repellent agent (TMSDMA) and the blocking fluid.

Further, the blocking fluid used here is the same as the diluent component of the silylation liquid. Therefore, when the blocking fluid is left in the state illustrated in FIG. 4C for a long time, the water-repellent component of the silylation liquid is diffused in the blocking fluid (PGMEA) so that a state similar to that of FIG. 4A may be obtained. As a result, the hydrolysis reaction may occur between the water-repellent component (TMSDMA) included in the liquid existing in the vicinity of the ejection port 434 of the silylation liquid flow path 431 and the water included in the air outside the ejection port 434. In this case, the concentration of the water-repellent component (TMSDMA) included in the liquid existing in the vicinity of the ejection port 434 of the silylation liquid flow path 431 is lower than that of the water-repellent component (TMSDMA) included in the silylation liquid supplied from the silylation liquid supply source 631. Therefore, it takes a long time until degradation proceeds to an extent that purge of the liquid is required. However, the operation illustrated in FIG. 4B should be performed in any case. Even in this case, there is no need to discard the expensive silylation liquid (TMSDMA+PGMEA) and the end portion of the silylation liquid flow path 431 may be purged using the blocking fluid (PGMEA) which is more inexpensive than the silylation liquid. Thus, the running cost may be reduced. In the second exemplary embodiment below, the same may be applied in case where IPA is used as the blocking fluid.

Second Exemplary Embodiment of Silylation Liquid Nozzle

The above-described exemplary embodiment uses PGMEA as the blocking fluid. However, the IPA which is an organic solvent for replacement may be used as the blocking fluid. In this case, the silylation liquid nozzle 43 may serve as the solvent nozzle 44 so that the solvent nozzle 44 may be eliminated. Descriptions will be made on the operation of the silylation liquid nozzle 43 in the first solvent replacement process, silylation process, and the second solvent replacement process in this case with reference to FIG. 5. Other processes (a chemical liquid processing process, a first rinse process, a second rinse process, and a drying process) are the same as those described above.

Figure 5A:
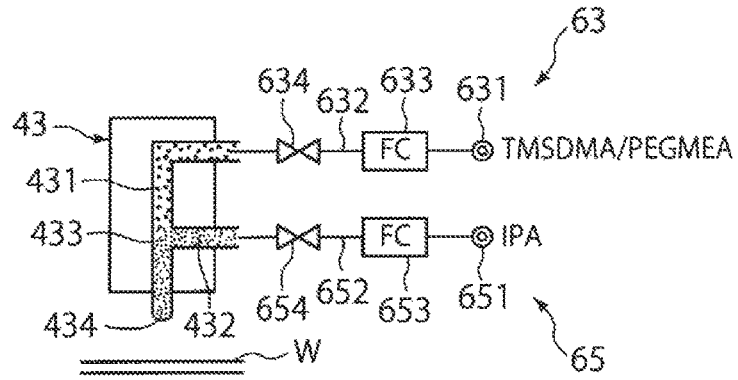
FIGS. 5A to 5D are views for describing a configuration and an action of a silylation liquid nozzle according to a second exemplary embodiment.

A state immediately before starting the first solvent replacement process (a state immediately after terminating the second solvent replacement process) is illustrated in FIG. 5A. Both the opening/closing valve 634 of the silylation liquid supply line 632 and the opening/closing valve 654 of the blocking fluid supply line 652 are closed. The area from the ejection port 434 in the silylation liquid flow path 431 to the vicinity of the junction 433 of the blocking fluid flow path 432 with the silylation liquid flow path 431 is filled with IPA serving as the blocking fluid, and the silylation liquid exists only in the portion upstream of the junction 433 in the silylation liquid flow path 431. Therefore, the contact between the silylation liquid and the atmospheric air which is the atmosphere outside the silylation liquid nozzle 43 is blocked by the IPA serving as the blocking fluid.

When the first solvent replacement process is started, the silylation liquid nozzle 43 is positioned at the processing position and the opening/closing valve 654 is opened. Then, as illustrated in FIG. 5B, the IPA is ejected from the silylation liquid nozzle 43 so that the first solvent replacement process may be performed.

Subsequently, when the silylation process is performed, the opening/closing valve 654 of the blocking fluid supply line 652 is closed and the opening/closing valve 634 of the silylation liquid supply line 632 is opened. Then, as illustrated in FIG. 5C, the silylation liquid is ejected from the silylation liquid nozzle 43 so that the silylation process may be performed.

Figure 5B:
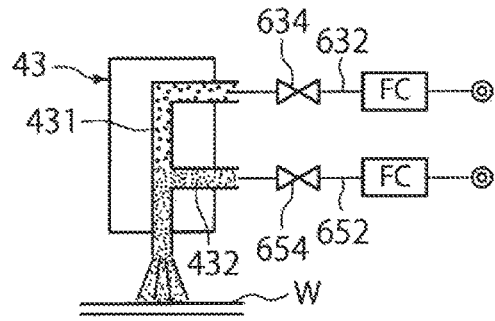
Figure 5C:
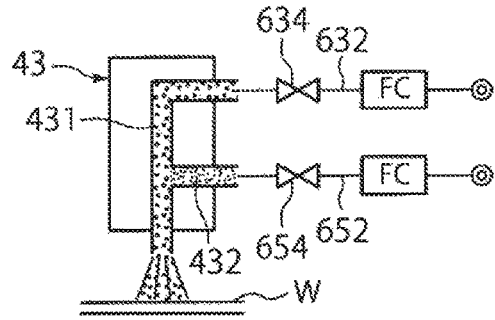

Further, the transition from the state illustrated in FIG. 5B to the state illustrated in FIG. 5C may be performed after stopping the ejection of the blocking fluid, as illustrated in FIG. 5A (at this time, both of the opening/closing valve 634 of the silylation liquid supply line 632 and the opening/closing valve 654 of the blocking fluid supply line 652 are closed), or directly performed without the state illustrated in FIG. 5A.

Subsequently, when the second solvent replacement process is performed, the opening/closing valve 634 of the silylation liquid supply line 632 is closed and the opening/closing valve 654 of the blocking fluid supply line 652 is opened. Then, as illustrated in FIG. 5B, the IPA is ejected again from the silylation liquid nozzle 43 so that the second solvent replacement process may be performed.

Figure 5D:
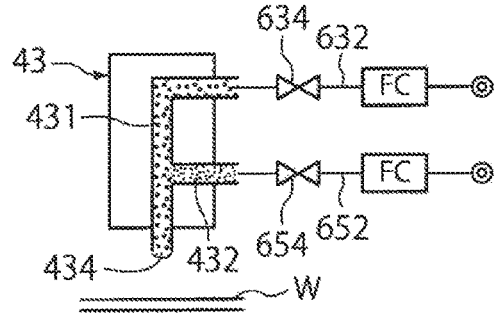

Further, the transition from the state illustrated in FIG. 5C to the state illustrated in FIG. 5B may be performed after stopping the ejection of the silylation liquid, as illustrated in FIG. 5D (at this time, both of the opening/closing valve 634 of the silylation liquid supply line 632 and the opening/closing valve 654 of the blocking fluid supply line 652 are closed), or directly performed without the state illustrated in FIG. 5D.

When the second solvent replacement process is terminated, the opening/closing valve 654 of the blocking fluid supply line 652 is closed. Then, as illustrated in FIG. 5A, the contact between the silylation liquid and the atmospheric air which is the atmosphere outside the silylation liquid nozzle 43 is blocked by the IPA serving as the blocking fluid.

In the second exemplary embodiment illustrated in FIGS. 5A to 5D, when the first solvent replacement process, the silylation process and the second solvent replacement process are being performed, it is not necessary to move the position of the silylation liquid nozzle 43 at all. Further, when the second solvent replacement process is terminated (i.e., at the time when the ejection of the IPA ends), the contact between the silylation liquid and the atmospheric air which is the atmosphere outside the silylation liquid nozzle 43 is blocked. Therefore, it is not necessary to perform a separate operation only for "blocking", thereby simplifying the process.

Further, the second exemplary embodiment illustrated in FIGS. 5A to 5D is executed in a state where the silylation liquid and the IPA coexist. However, since the IPA is a chemical liquid which intermediates the replacement between the silylation liquid and DIW, there is no problem.

Although the second exemplary embodiment may abolish the solvent nozzle 44 may be eliminated, the solvent nozzle 44 may not be abolished. That is, the IPA may be used instead of the PGMEA serving as the blocking fluid which is used in the first exemplary embodiment, and the solvent nozzle 44 which supplies the IPA to the wafer W in the solvent replacement process, may be left.

Third Exemplary Embodiment of Silylation Liquid Nozzle

Although the silylation liquid nozzle 43 according to the first and second exemplary embodiments uses a liquid organic solvent (PGMEA, IPA) as the blocking fluid, but is not limited thereto. The blocking fluid may be a gas which does not contain water or contains a small amount of water. As the gas, for example, N2 (nitrogen) gas or clean dry air (CDA) which is frequently used for manufacturing a semiconductor device may be used.

Figure 6A:
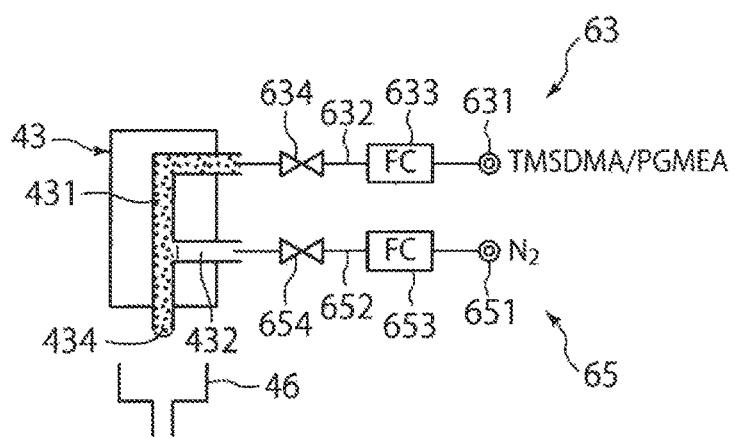
FIGS. 6A and 6B are views for describing a configuration and an action of a silylation liquid nozzle according to a third exemplary embodiment.
Figure 6B:
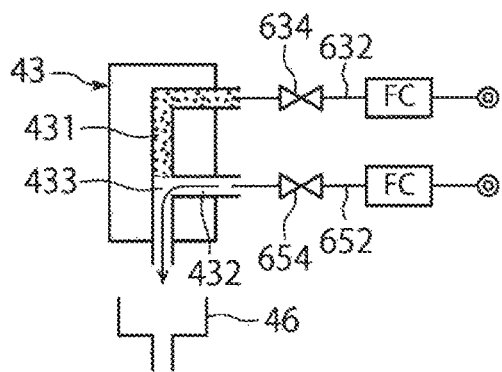

In the third exemplary embodiment, after the ejection of the silylation liquid is terminated and the silylation liquid nozzle 43 in which the silylation liquid flow path 431 is filled with the silylation liquid as illustrated in FIG. 6A is returned to the retreat position, preferably, immediately after the silylation liquid nozzle 43 is returned to the retreat position, the N2 gas serving as the blocking fluid is ejected from the silylation liquid nozzle 43 by opening the opening/closing valve 654 of the blocking fluid supply line 652 as illustrated in FIG. 6B (at this time, the opening/closing valve 634 of the silylation liquid supply line 632 is closed). Thus, the silylation liquid staying in the vicinity of the ejection port 434 of the silylation liquid flow path 431 is pushed out by the N2 gas. Thereafter, the N2 gas is allowed to continuously flow at a small flow rate until the process for the next wafer W is initiated. As a result, the silylation liquid is in contact with the N2 gas which hardly contains water, thereby preventing occurrence the hydrolysis in the silylation liquid.

In the first to third exemplary embodiments, the silylation liquid filled in the silylation liquid flow path 431 in the silylation liquid nozzle 43 is pushed out by the blocking fluid, but is not limited thereto. The blocking fluid may be supplied from the blocking fluid flow path 432 after the position of the front end of the silylation liquid is retreated to a position upstream of the junction 433 of the silylation liquid flow path 431 with the blocking fluid flow path 432 by providing a suck-back mechanism (see, e.g., a fourth exemplary embodiment below) in the silylation liquid supply line 632 to suck the silylation liquid staying within the silylation liquid flow path 431 of the silylation liquid nozzle 43.

Fourth Exemplary Embodiment of Silylation Liquid Nozzle

In the first to third exemplary embodiments, the blocking fluid is supplied to the silylation liquid flow path 431 from the blocking fluid flow path 432 which joins the silylation liquid flow path 431, but is not limited thereto. The blocking fluid may be supplied from the outside of the silylation liquid nozzle 43, specifically, the ejection port 434 into the silylation liquid flow path 431. The configuration which enables this will be described with reference to FIGS. 7A and 7B.

A silylation liquid nozzle 43' according to the fourth embodiment includes the silylation liquid flow path 431 therein, but does not include the blocking fluid flow path 432. In the same manner as the first to third exemplary embodiments, the silylation liquid flow path 431 is connected to a silylation liquid supply source 631, and connected to a silylation liquid supply line 632 in which a flow rate control mechanism (FC) 633 and an opening/closing valve 634 are interposed.

A blocking fluid supply mechanism according to the fourth exemplary embodiment is provided with a liquid storage unit 701 capable of storing the blocking fluid. The liquid storage unit 701 is positioned at a position to which the silylation liquid nozzle 43 positioned at a retreat position (or in the vicinity thereof) is accessible. The arm 45 (see, e.g., FIG. 2) is vertically movable, and thus the silylation liquid nozzle 43 is also vertically movable. The liquid storage unit 701 is supplied with PGMEA or IPA (liquid) serving as the blocking fluid from a blocking fluid line 703 connected to a blocking fluid supply source 702, in which an opening/closing valve 704 is interposed in the blocking fluid line 703. A drain line 705 is connected to the liquid storage unit 701, in which an opening/closing valve 706 is interposed in the drain line 705.

The blocking fluid supply mechanism further includes a suction mechanism which exerts a suction force on the ejection port 434 through the silylation liquid flow path 431 when the ejection port 434 of the silylation liquid nozzle 43' is immersed in the blocking fluid stored in the liquid storage unit 701. In the fourth exemplary embodiment, the suction mechanism is constituted with a drain line 707 branching from the silylation liquid supply line 632, and an opening/closing valve 708 interposed in the drain line 707 at a junction 636 set at a portion downstream of the opening/closing valve 634. The suction mechanism is referred to as a suck-back mechanism.

The functions thereof will be described. The opening/closing valve 708 in the drain line 707 is closed during the ejection of the silylation liquid and is continuously closed even after the ejection of the silylation liquid. The entire area from the junction 636 to the opening/closing valve 708 is filled with the silylation liquid. In the silylation process, the opening/closing valve 634 is opened so that the silylation liquid is supplied from the nozzle 43' positioned at the processing position to the wafer W. Then, the opening/closing valve 634 is closed so that the silylation process is terminated. After a series of processes after the silylation process on one wafer W are terminated, the nozzle 43' is returned to the retreat position.

Figure 7A:
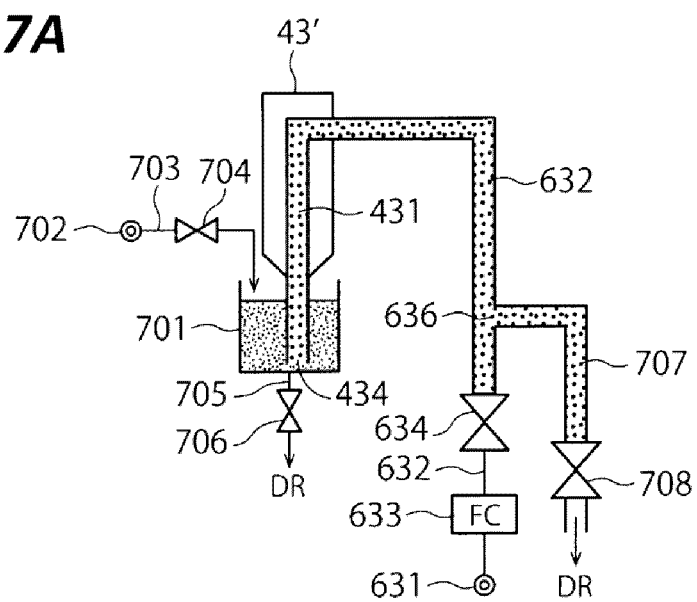
FIGS. 7A and 7B are schematic views for describing configurations and actions of a silylation liquid nozzle according to a fourth exemplary embodiment and a blocking fluid supply mechanism related to the silylation liquid nozzle.

Next, as illustrated in FIG. 7A, the blocking fluid (e.g., liquid PGMEA or IPA) is stored in the liquid storage unit 701. Further, the nozzle 43' is positioned immediately above the liquid storage unit 701 and then lowered so that the ejection port 434 is immersed in the blocking fluid within the liquid storage unit 701.

Figure 7B:
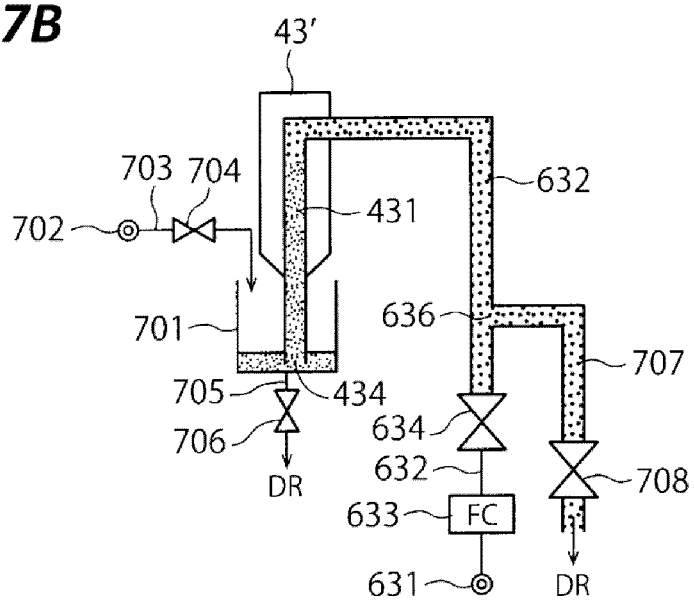

In this state, the silylation liquid within the drain line 707 is ejected therefrom when the opening/closing valve 708 is opened. Then, as illustrated in FIG. 7B, the suction force is exerted to the ejection port 434 of the nozzle 43' through the silylation liquid supply line 632 and the silylation liquid flow path 431 according to the principle of siphon so that the blocking fluid within the liquid storage unit 701 is introduced into the silylation liquid flow path 431. Of course, the opening/closing valve 708 is positioned at a position lower than the height position of the ejection port 434 of the nozzle 43'. At an appropriate timing, for example, before the level of the blocking fluid within the liquid storage unit 701 becomes lower than the ejection port 434 of the nozzle 43', the opening/closing valve 708 is closed. Accordingly, the suction of the blocking fluid is stopped.

By performing the sequence described above, as illustrated in FIG. 7B, a predetermined range from the ejection port 434 in the silylation liquid flow path 431 is filled with the blocking fluid. That is, the silylation liquid existing in a portion upstream of the range filled with the blocking fluid is blocked from the atmosphere outside the ejection port 434.

After the sequence described above is terminated, the nozzle 43' is moved up to be taken out from the liquid storage unit 701 and retreated to the retreat position. Further, since the silylation liquid remaining in the silylation liquid flow path 431 is dissolved in the blocking fluid which has existed within the liquid storage unit 701, it is desirable that the blocking fluid should be discarded. In this case, the blocking fluid within the liquid storage unit 701 is discarded from the drain line 705 by opening the opening/closing valve 706.

In the fourth exemplary embodiment, it is not necessary to provide a special configuration (blocking fluid flow path 432) to a nozzle and a general purpose nozzle may be used. Further, the suck-back mechanism is a mechanism which is frequently employed to prevent a liquid from being dripped from an ejection port without being limited the ejection of the silylation liquid. That is, since the fourth exemplary embodiment may be implemented merely by adding, for example, the liquid storage unit 701 to the conventional configuration, the increase of costs for an apparatus can be suppressed.

The present disclosure is not limited to the exemplary embodiments described above, and various modifications may be made thereto. Further, a substrate to be processed may be another kind of substrate such as, for example, a glass substrate, or a ceramic substrate without being limited to a semiconductor wafer.

From the foregoing, it will be appreciated that various exemplary embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate liquid processing apparatus comprising:
   a processing unit configured to perform a water repellency imparting processing on a substrate by supplying a silylation liquid to the substrate;
   a nozzle including therein an ejection port configured to supply the silylation liquid to the substrate positioned in the processing unit,
   a silylation liquid flow path in the nozzle formed in a vertical direction in which the silylation liquid flows in the nozzle toward the ejection port and an end portion of the silylation liquid flow path, and a blocking fluid flow path in the nozzle formed in a horizontal direction joins with the silylation liquid flow path at a junction located at an upstream side of the ejection port such that a flow of a blocking fluid block the silylation liquid within the silylation liquid flow path in the nozzle from an atmosphere outside the election port by filling a portion of the silylation liquid flow path in the nozzle between the junction and the ejection port with the blocking fluid; wherein said junction is located within the nozzle at a connection point between the silylation liquid flow path and the blocking fluid flow path such that the silylation liquid and blocking fluid are capable of being elected from the end portion of the silylation liquid flow path;
   silylation liquid supply mechanism configured to supply the silylation liquid to the silylation liquid flow path in the nozzle through a silylation liquid supply line; and
   a blocking fluid supply mechanism connected to the blocking fluid flow path of the nozzle through a blocking fluid supply line and configured to supply the blocking fluid to the blocking fluid flow path such that the silylation liquid existing at an upstream side of the junction remaining within the portion of the silylation liquid flow path between the junction and the ejection port in the nozzle protected from the atmosphere outside the ejection port by the blocking fluid filled in an area in the nozzle between the junction and the ejection port within the silylation liquid flow path.

2. The substrate liquid processing apparatus of claim 1, wherein the blocking fluid is a liquid, and the blocking fluid supply mechanism includes a valve on the blocking fluid supply line, the blocking fluid supply mechanism being configured to open the opening/closing valve for a predetermined length of time and close the valve after the blocking fluid is supplied to the silylation liquid flow path so that the silylation liquid flow path from a position, where the blocking fluid flow path is connected, to the ejection port is filled with the blocking fluid.

3. The substrate liquid processing apparatus of claim 1, wherein the blocking fluid is an organic solvent.

4. The substrate liquid processing apparatus of claim 1, wherein the silylation liquid is a water-repellent agent diluted by a thinner, and the blocking fluid is the thinner.

5. The substrate liquid processing apparatus of claim 2, wherein the blocking fluid is compatible with the silylation liquid, and is also compatible with a pure water.

6. The substrate liquid processing apparatus of claim 1, wherein the blocking fluid is a gas, and the blocking fluid supply mechanism includes a valve on the blocking fluid supply line, the blocking fluid supply mechanism being configured to continuously supply the gas to the blocking fluid flow path in a state where the valve is opened so that the blocking fluid flow path and the silylation liquid flow path from a position, in which the blocking fluid flow path is connected, to the ejection port are filled with the blocking fluid.

7. A substrate liquid processing method using the substrate liquid processing apparatus, said substrate liquid processing apparatus comprising:
   a processing unit configured to perform a water repellency imparting processing on a substrate by supplying a silylation liquid to the substrate;
   a nozzle including therein an election port configured to supply the silylation liquid to the substrate positioned in the processing unit,
   silylation liquid flow path in the nozzle formed in a vertical direction in which the silylation liquid flows in the nozzle toward the election port and an end portion of the silylation liquid flow path, and a blocking fluid flow path in the nozzle formed in a horizontal direction joins with the silylation liquid flow path at a junction located at an upstream side of the election port such that a flow of a blocking fluid blocks the silylation liquid within the silylation liquid flow path in the nozzle from an atmosphere outside the election port by filling a potion of the silylation liquid flow path in the nozzle between the junction and the ejection port with the blocking fluid: wherein said junction is located within the nozzle at a connection point between the silylation flow path and the blocking fluid flow path such that the silylation liquid and blocking fluid are capable of being elected from the end portion of the silylation liquid flow path;
   a silylation liquid supply mechanism configured to supply the silylation liquid to the silylation liquid flow path in the nozzle through a silylation liquid supply line; and
   a blocking fluid supply mechanism connected to the blocking fluid flow path of the nozzle through a blocking fluid supply line and configured to supply the blocking fluid to the blocking fluid flow path such that the silylation liquid existing at an upstream side of the junction remaining within the portion of the silylation liquid flow path between the junction and the election port in the nozzle is protected from the atmosphere outside the election port by the blocking fluid filled in an area in the nozzle between the junction and the ejection port within the silylation liquid flow path,
   the substrate liquid processing method comprising: performing the water repellency imparting processing on the substrate water repellent by supplying the silylation liquid to the substrate from the ejection port of the nozzle; stopping the supply of the silylation liquid from the nozzle; and supplying the blocking fluid to the silylation liquid flow path to block the silylation liquid within the silylation liquid flow path from the atmosphere outside the election port by the blocking fluid.

8. The substrate liquid processing method of claim 7, wherein the nozzle includes the blocking fluid flow path connected to the silylation liquid flow path at the connection position set at an upstream side of the ejection port, and the blocking fluid is supplied to the silylation liquid flow path in the nozzle from the blocking fluid flow path so that the silylation liquid within the silylation liquid flow path at a downstream side of the connection position is purged by the blocking fluid and the silylation liquid within the silylation liquid flow path at the upstream side of the connection position is blocked from the atmosphere outside the ejection port by the blocking fluid.

9. The substrate liquid processing method of claim 8, wherein the blocking fluid is a liquid, and flowing of the blocking fluid is stopped after the silylation liquid is purged by the blocking fluid so that the blocking fluid flow path and the silylation path from the connection position to the ejection port are filled with the blocking fluid.

10. The substrate liquid processing method of claim 9, wherein the blocking fluid is an organic solvent.

11. The substrate liquid processing method of claim 9, wherein the silylation liquid is a water-repellent agent diluted by a thinner, and the blocking fluid is the thinner.

12. The substrate liquid processing method of claim 9, wherein the blocking fluid is compatible with the silylation liquid, and is also compatible with pure water.

13. The substrate liquid processing method of claim 8, wherein the blocking fluid is a gas, and the blocking fluid flow path and the silylation path from the connection position to the ejection port are filled with the blocking fluid by continuously supplying the blocking fluid to the blocking fluid flow path even after the silylation liquid is purged by the blocking fluid.

14. The substrate liquid processing apparatus of claim 1, further comprising: a liquid receiver disposed below the nozzle so as to receive the blocking fluid when the nozzle is positioned at a retreat position retracted from a processing position.

* * * * *